United States Patent
Yamazaki et al.

(10) Patent No.: US 6,373,129 B1
(45) Date of Patent: Apr. 16, 2002

(54) SEMICONDUCTOR APPARATUS WITH PRESSURE CONTACT SEMICONDUCTOR CHIPS

(75) Inventors: Kazuaki Yamazaki; Yoshikazu Takahashi, both of Nagano (JP)

(73) Assignee: Fuji Electric Co., Ltd., Kawasaki (JP)

(*) Notice: Subject to any disclaimer, the term of this patent is extended or adjusted under 35 U.S.C. 154(b) by 0 days.

(21) Appl. No.: 09/590,269

(22) Filed: Jun. 9, 2000

(30) Foreign Application Priority Data

Jul. 23, 1999 (JP) .......................................... 11-208809

(51) Int. Cl.⁷ ............................................. H01L 23/48
(52) U.S. Cl. ........................ 257/688; 257/181; 257/723
(58) Field of Search ................................. 257/688, 181, 257/723, 107, 785, 133, 139

(56) References Cited

U.S. PATENT DOCUMENTS

| | | | | |
|---|---|---|---|---|
| 5,610,439 A | * | 3/1997 | Hiyoshi et al. | 257/688 |
| 5,777,351 A | * | 7/1998 | Taguchi et al. | 257/181 |
| 5,990,501 A | * | 11/1999 | Hiyoshi et al. | 257/181 |
| 6,072,200 A | * | 6/2000 | Gruning et al. | 257/177 |
| 6,166,402 A | * | 12/2000 | Kodani et al. | 257/182 |

* cited by examiner

*Primary Examiner*—Phat X. Cao
(74) *Attorney, Agent, or Firm*—Kanesaka & Takeuchi

(57) ABSTRACT

A semiconductor apparatus includes a plurality of semiconductor units and a common gate liner having silicon chip resistors at portions corresponding to the semiconductor units. Each unit includes a semiconductor chip, a collector base plate fixed to the chip, an insulative positioning guide, an emitter contact terminal, and a contact probe having two distal contact ends. The positioning guide positions the emitter contact terminal on the emitter electrode and the contact probe on a gate pad. The semiconductor units are collectively held by the gate liner such that the contact probes press the respective silicon chip resistors and the respective gate pads. The individual positioning guide prevents dislocation of the contact probe and the gate pad. The semiconductor apparatus simplifies the gate wiring and improves the precise positioning of the constituent elements and the reliability of the apparatus. The package size is reduced as well.

9 Claims, 5 Drawing Sheets

SEMICONDUCTOR APPARATUS WITH PRESSURE CONTACT SEMICONDUCTOR CHIPS

BACKGROUND OF THE INVENTION AND RELATED ART STATEMENT

The present invention relates to a semiconductor apparatus including a plurality of power devices, such as insulated gate bipolar transistors (IGBTs). More specifically, the present invention relates to a semiconductor apparatus of a pressure contact type including a flat package that incorporates a plurality of semiconductor chips, each including a first main electrode (emitter) and a control electrode (gate) on a first major surface thereof, and a second main electrode (collector) on a second major surface thereof.

IGBTs are used widely as power switching devices in an inverter for controlling the speed of a motor. Recently, applications of the IGBT are extended to the high capacity area where gate turn-off (GTO) thyristors have been used conventionally, since the IGBT is of voltage-drive-type to be easily used, and the safe working area of the IGBT is wide.

In manufacturing metal oxide semiconductor (MOS) control devices, such as IGBTs, the precision from several microns to submicrons is required, different in manufacturing the conventional GTO thyristors. Thus, the manufacturing process of forming a plurality of MOS control devices on one single wide wafer is not employable for obtaining a high throughput. In manufacturing a high-capacity semiconductor apparatus including a plurality of MOS control devices, it is necessary to mount a plurality of MOS device chips, each having 10 mm×10 mm to 28 mm×28 mm in area, in parallel to each other on a package.

In the MOS control device such as an IGBT, an emitter electrode and a gate electrode are formed side by side on a major surface of the semiconductor chip. Due to this configuration, in a general semiconductor module including a plurality of IGBTs incorporated in a package, current paths are formed by mounting the collectors formed on bottom surfaces of the IGBT chips on a metal base plate and by individually connecting the emitter electrodes and the gate electrodes to lead-out terminals with aluminum bonding wires. The metal base plate works also as a radiator for radiating heat generated in the IGBTs. The package including the IGBT chips incorporated therein is covered with a plastic casing and sealed with a resin, such as silicone gel.

In flat IGBTs of a pressure contact type for use in high electric power, a perfect air-tight structure, that covers the IGBT package with a ceramic casing and seals nitrogen gas in the ceramic casing, is employed. Metal electrodes of molybdenum and the like are pressed to contact the collector electrodes and the emitter electrodes of the IGBT chips for forming current paths and for radiating heat generated in the IGBT chips.

The semiconductor apparatus disclosed in Japanese Unexamined Patent Publication (KOKAI) No. H07-94673 uses aluminum bonding wires for the connection of the gates of the IGBT chips, since any current does not flow through the gates even when a bias voltage is applied thereto.

Japanese Unexamined Patent Publication (KOKAI) No. H11-97462 discloses another method for gate wiring that uses a contact probe. The chip-side end face of the contact probe is provided with a spring function and a lead wire is connected to the other end face of the contact probe. A general wire wound resistor is connected to the lead wire. Finally, a plurality of lead wires from the wire wound resistors is bunched to form a gate terminal for the flat IGBT package. A plurality of such contact probes is fixed to a resin frame that positions a plurality of the IGBT chips.

Recently, the flat IGBT of the pressure contact type has been used more widely and the capacity thereof has been increasing. As the applications of the flat IGBT of the pressure contact type and the capacity thereof increase, it is required for the flat IGBT of the pressure contact type to exhibit an improved reliability and an improved breakdown voltage.

However, the semiconductor apparatus, that uses aluminum bonding wires for the gate wiring, is not suitable for increasing the breakdown voltage. More in detail, there is no problem for the breakdown voltage up to around 2500 V. However, when the voltage of more than 4000 V is applied, an electric field localizes to the fine bonding wires of 300 $\mu$m in diameter and discharge occurs between the collector and the portion of the bonding wires, to which the electric field is localized.

In the semiconductor apparatus that uses the conventional contact probe, the lead wires are led out from the resin frame, to which the contact probes are fixed, and the led out lead wires are bunched to form a gate terminal. Thus, the gate wiring is very complicated, and if a number of chips is increased to increase the current capacity, it can not house the IGBT chips in one package. As the constituent elements increase, the reliability of the semiconductor apparatus is decreased.

With increasing the current capacity of the flat IGBT package, the number of the IGBT chips in the package increases. If many contact probes are arranged on a resin frame, it impairs the precise positioning of the contact probes on the gate pads of the IGBT chips and causes dislocation between the constituent elements by cyclic temperature changes due to the differences between the thermal expansion coefficients of the constituent elements.

In view of the foregoing, it is an object of the invention to provide a semiconductor apparatus of a pressure contact type, including a flat package incorporating a plurality of MOS devices such as IGBTS, which facilitates to reduce a number of constituent elements and improve precise positioning of the constituent elements.

It is another object of the invention to provide a semiconductor apparatus of the pressure contact type, which facilitates to improve the breakdown voltage, current capacity and reliability thereof.

SUMMARY OF THE INVENTION

According to the invention, there is provided a semiconductor apparatus of a pressure contact type constituting a flat package, including a plurality of semiconductor chips, each having a first major surface, a second major surface, a first main electrode on the first major surface, a control electrode on the first major surface, and a second main electrode on the second major surface. The semiconductor apparatus includes a control base plate having an opening formed at a position corresponding to the first major electrodes of the semiconductor chips and electrically conductive sections formed at positions facing the control electrodes of the semiconductor chips, and pressure contact electrodes. Each pressure contact electrode has two distal contact ends, and is arranged between corresponding one of the control electrodes of the semiconductor chips and corresponding one of the electrically conductive sections of the control base plate. One of the distal contact ends thereof contacts the corresponding one of the control electrodes, and the other of the distal contact ends contacts the corresponding one of the electrically conductive sections of the control base plate. The pressure contact electrodes transmit a control signal from the control base plate to the semiconductor chips.

The semiconductor apparatus according to the invention connects the common control base plate and the control electrodes of the semiconductor chips with the pressure contact electrodes, each having two distal contact ends. The pressure contact electrode, which is thicker than the lead wire, prevents discharge between the collector electrode and the pressure contact electrode, and facilitates to improve the breakdown voltage. Since the constituent elements for gate wiring are the pressure contact electrodes arranged corresponding to the control electrodes of the semiconductor chips and the common control base plate common to the package, the number of the constituent elements is greatly reduced, the failure rate is suppressed to the minimum level and the package size is reduced.

DETAILED DESCRIPTION OF THE PREFERRED EMBODIMENTS

Now the present invention will be explained hereinafter in connection with flat IGBTs of a pressure contact type and with reference to the accompanying drawings which illustrate the preferred embodiments of the invention.

Figure 1:
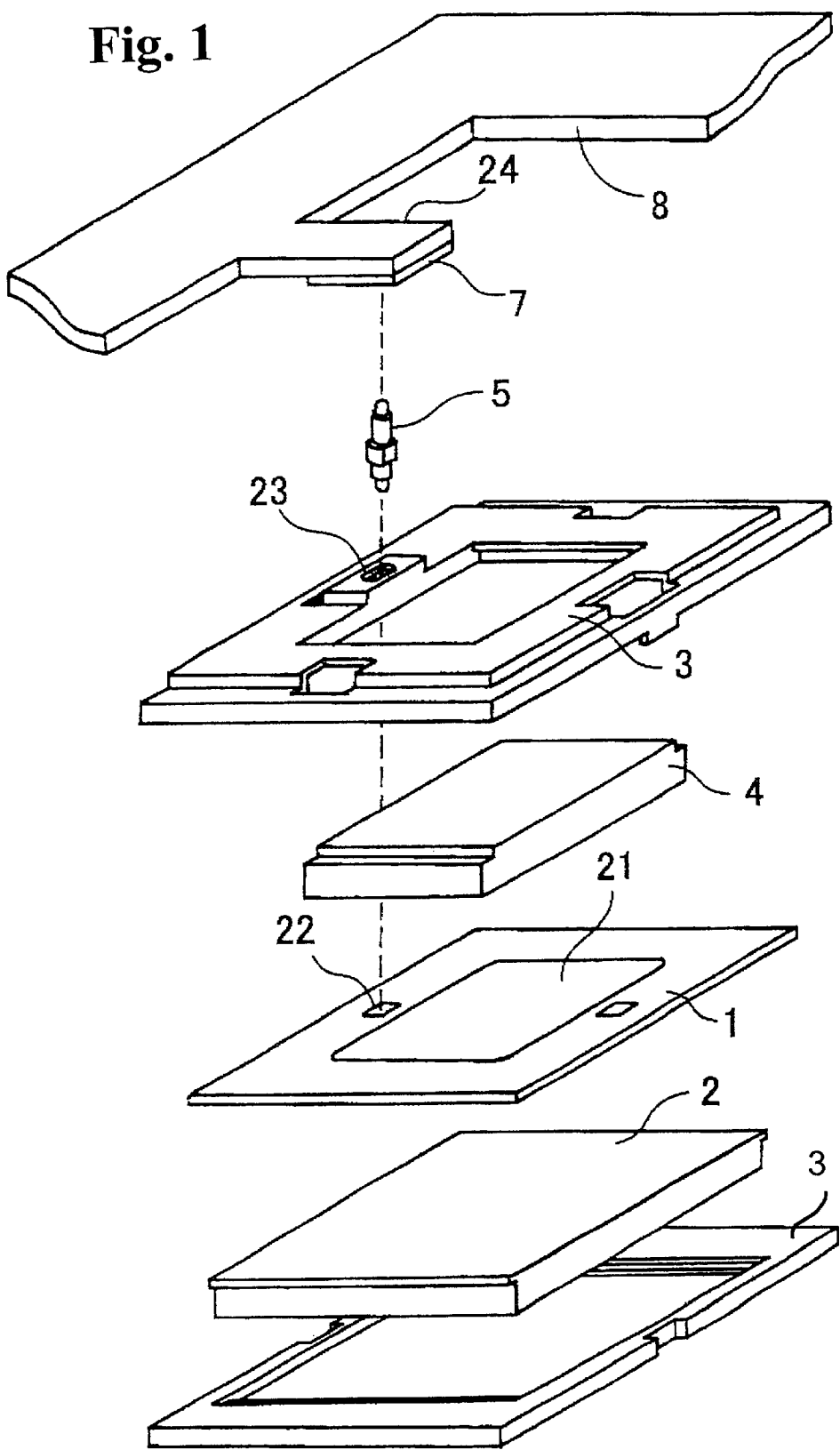
FIG. 1 is an exploded perspective view of a main part of a semiconductor apparatus according to a first embodiment of the invention.
Figure 2:
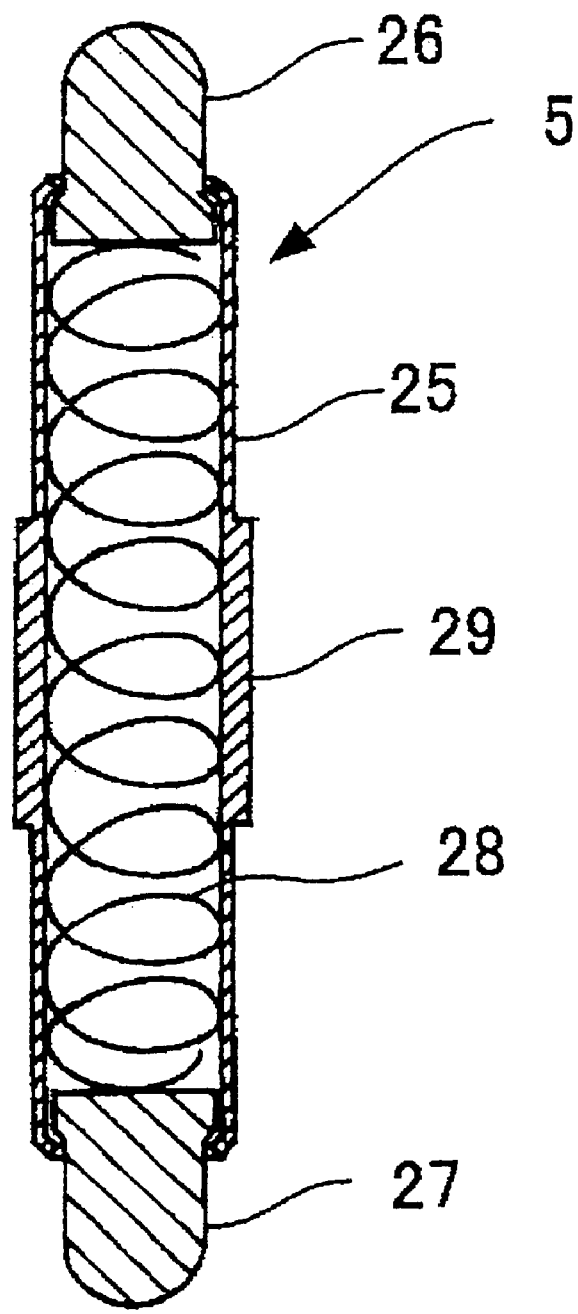
FIG. 2 is a cross sectional view of a contact probe shown in FIG. 1.
Figure 3:
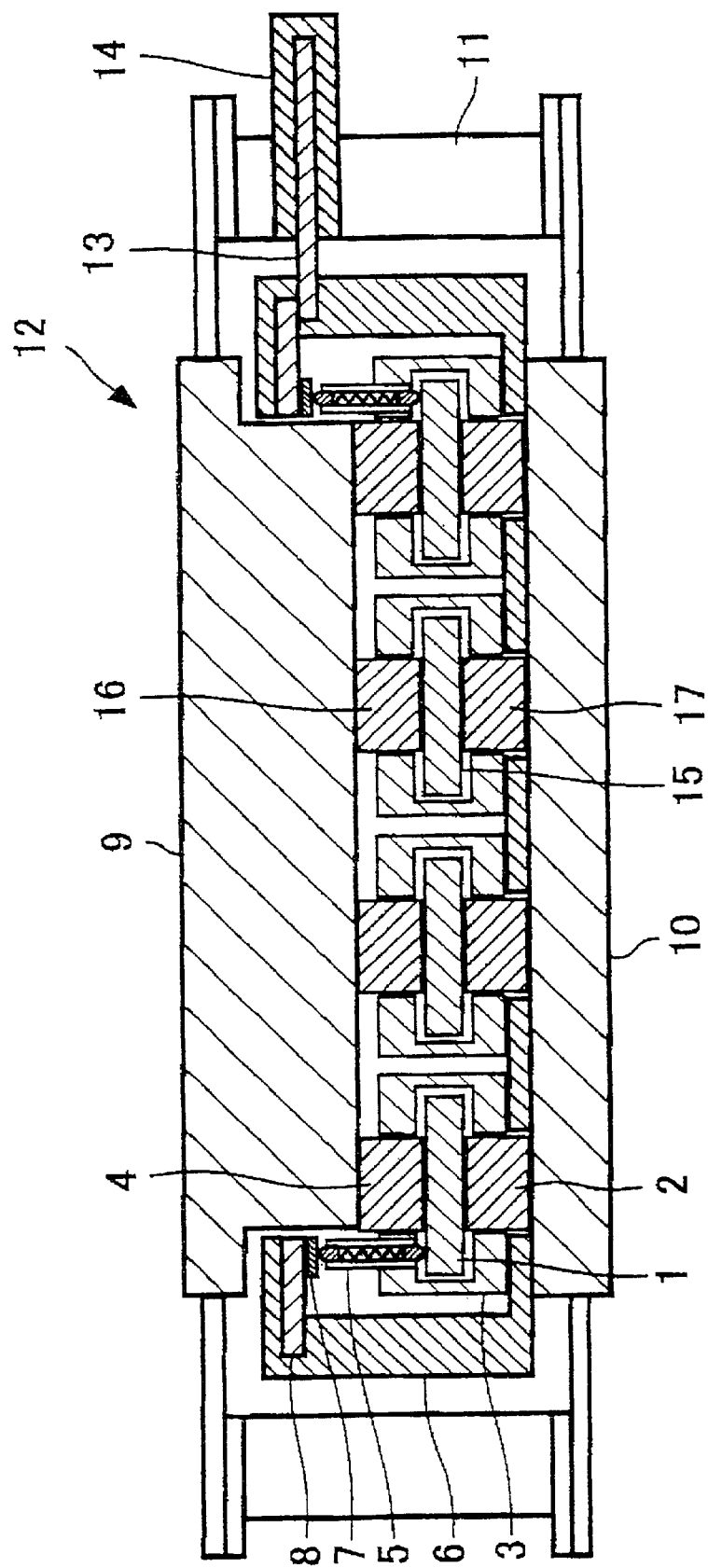
FIG. 3 is a cross sectional view of the semiconductor apparatus shown in FIG. 1.
Figure 4:
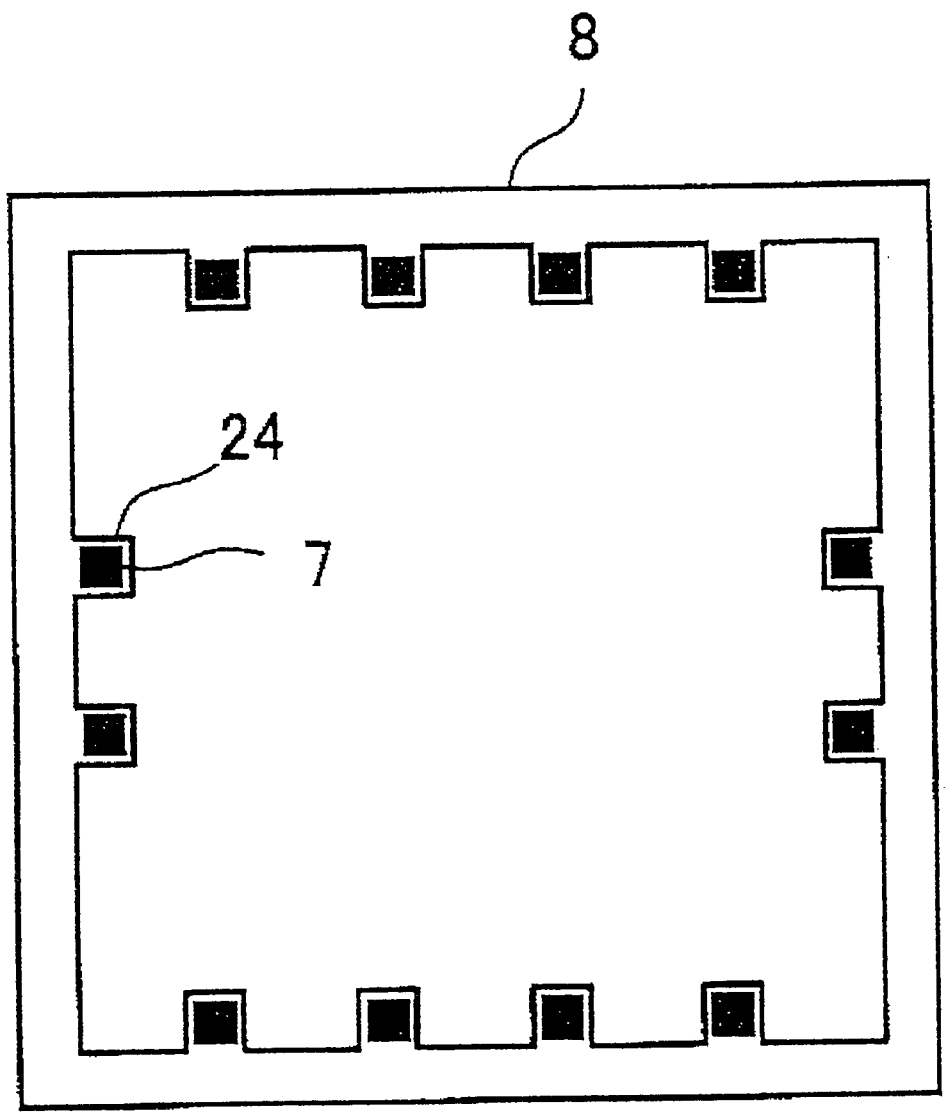
FIG. 4 is a bottom view of a gate liner of FIG. 1.

FIG. 1 is an exploded perspective view showing a magnified main part of a semiconductor apparatus according to a first embodiment of the invention. FIG. 2 is a cross sectional view of a contact probe shown in FIG. 1. FIG. 3 is a cross sectional view of the semiconductor apparatus shown in FIG. 1. FIG. 4 is a bottom plan view of a gate liner shown in FIG. 1.

Referring at first to FIG. 3, the semiconductor apparatus includes a plurality of individual semiconductor units. Each semiconductor unit includes an IGBT chip 1; a collector base plate 2 positioned beneath a collector electrode, that is a second main electrode on a second major surface of the IGBT chip 1; an insulative positioning guide 3; an emitter contact terminal 4 positioned by the insulative positioning guide 3 on an emitter electrode, that is a first main electrode on a first major surface of the IGBT chip 1; and a contact probe 5 positioned by the insulative positioning guide 3 on a gate pad, that is a control electrode also formed on the first major surface of the IGBT chip 1. The contact probe 5 contacts at contact ends thereof with the gate pad and a silicon chip resistor 7 described later. The semiconductor units are arranged in an outer frame 6 with a certain space therebetween. A gate liner 8, that is a control base plate for transmitting a control signal to the control electrodes of the IGBT chips 1, is mounted on the outer frame 6. The silicon chip resistors 7 are fixed to the under surface of the gate liner 8 at locations where the contact probes 5 are positioned.

The structure described above is sandwiched by an upper common electrode plate 9 contacting the emitter contact terminals 4 and a lower common electrode plate 10 contacting the collector base plates 2. The common electrode plates 9 and 10 are made of copper. The sandwich structure described above is housed in a ceramic insulative cylindrical tube 11. Thus, a flat package 12 of the pressure contact type is configured. A lead wire 13 is connected to the gate liner 8. The lead wire 13 is inserted into a metal pipe 14 and is press-fitted therein. Thus, a control electrode for the flat package 12 is formed. Preferably, freewheel diode chips 15 are arranged in the central part of the flat package 12 where the gate liner 8 is not extended. An anode terminal 16 is positioned by the positioning guide 3 on an anode of the freewheel diode chip 15. A cathode base plate 17 is positioned by the positioning guide 3 beneath a cathode of the freewheel diode chip 15.

Now, the single semiconductor unit including the IGBT chip 1 will be described more in detail. Referring now to FIG. 1, the IGBT chip 1 has an emitter electrode 21 and a gate pad 22 on the first major surface thereof. The second major surface of the IGBT chip 1, that is, a rear surface of the IGBT chip, works as a collector electrode. The collector electrode of the IGBT chip 1 is soldered to the molybdenum collector base plate 2. The molybdenum emitter contact terminal 4 is arranged on the emitter electrode 21 of the IGBT chip 1. The emitter contact terminal 4 is positioned precisely onto the surface of the emitter electrode 21 of the IGBT chip 1 by inserting the emitter contact terminal 4 into a central opening of the positioning guide 3. The emitter contact terminal 4 pressing the IGBT chip 1 and the collector base plate 2 soldered to the IGBT chip 1 provide electrical connections between the IGBT chip 1 and the common electrode plates 9, 10 and facilitate heat radiation from the IGBT chip 1.

A supporting hole 23 for supporting the contact probe 5 is bored in the positioning guide 3 at a location corresponding to the gate pad 22 of the IGBT chip 1. By inserting the contact probe 5 into the supporting hole 23, the lower distal end of the contact probe 5 is positioned precisely onto the gate pad 22. The gate liner 8 supported by the outer frame 6 includes a protrusion 24 protruding to the location corresponding to the supporting hole 23 of the positioning guide 3. The silicon chip resistor 7 is bonded to the lower surface of the protrusion 24. When the gate liner 8 is mounted on the semiconductor unit, the silicon chip resistor 7 is pressed to contact an upper distal end of the contact probe 5.

Referring now to FIG. 2, the contact probe 5 is a pressure contact electrode having two distal contact ends and includes an electrically conductive cylindrical tube 25 having two open ends; electrically conductive contactors 26 and 27 closing the open ends of the cylindrical tube 25 and freely slidable in a longitudinal direction of the cylindrical tube 25 to be retained in the cylindrical tube 25; and a coil spring 28 pressing the contactors 26 and 27 outwardly in the longitudinal direction of the cylindrical tube 25. A flange 29 is formed around the central part of the cylindrical tube 25. When the contact probe 5 is inserted in the supporting hole 23 of the positioning guide 3, the flange 29 is coupled with a step portion formed inside the supporting hole 23 so that the contact probe 5 may not come out through the positioning guide 3. Since the coil spring 28 in the cylindrical tube 25 of the contact probe 5 presses the contactors 26 and 27 to the silicon chip resistor 7 and the gate pad 22, respectively, to contact therewith, the contact probe 5 simplifies the wiring between the gate electrode and the gate liner 8 in the individual semiconductor unit.

Referring now to FIG. 4, the gate liner 8 has an opening in the central part thereof, in which the semiconductor units including the IGBT chips 1 are arranged side by side. The central opening of the gate liner 8 is bored corresponding to the emitter electrodes of the IGBT chips 1. The upper common electrode plate 9 in pressure contact with the emitter contact terminals 4 on the emitter electrodes is inserted in the central opening of the gate liner 8.

The gate liner 8 has the protrusions 24 extending inwardly to the locations corresponding to the gate pads 22 of the IGBT chips 1. The silicon chip resistor 7 is fixed to each of the protrusions 24. The gate liner 8 illustrated in FIG. 4 is used for the package that includes 4×4 pieces of semiconductor chips arranged side by side. When 4×4 pieces of the semiconductor chips are included, twelve semiconductor units, each including the IGBT chip 1, are arranged in the peripheral portion of the opening and four semiconductor units, each including the freewheel diode chip 15, are arranged in the central portion of the opening. Therefore, twelve protrusions 24 and twelve silicon chip resistors 7 are arranged on the illustrated gate liner 8. The silicon chip resistors 7 absorb the imbalance between the switching speeds of the plural IGBTs arranged side by side when the IGBTs simultaneously execute switching operations.

Since the positioning guide 3 for positioning the emitter contact terminal 4 on the emitter electrode of the IGBT chip 1, to which the collector base plate 2 is fixed, supports the contact probe 5 that is a pressure contact electrode, the contact probe 5 is positioned precisely onto the gate pad 22. A small number of constituent elements including only the contact probe 5 for the semiconductor chip and the common gate liner 8 for the entire package are used for leading out the control wiring from the gate electrode. Therefore, even when the current capacity of the flat IGBT package, i.e. the number of IGBT chips connected in parallel to each other, is large, the failure rate, that increases with increase of the constituent elements, is suppressed at a minimum level and the package size is reduced.

Even when the relative positional relations between the IGBT chips and the gate liner 8 are changed by the heat generated in the operating IGBT chips 1 due to the differences of the thermal expansion coefficients of the constituent elements, dislocation hardly occurs between the contact probes 5 and the gate pads 22. Therefore, stable contact for the gate wiring is obtained and dielectric breakdown caused by dislocation of the constituent elements can be avoided. Since the contact probe 5 is much thicker than the bonding wire, discharge between the contact probe 5 and the collector electrode is prevented. Therefore, the breakdown voltage of the semiconductor apparatus is improved according to the invention.

Figure 5:
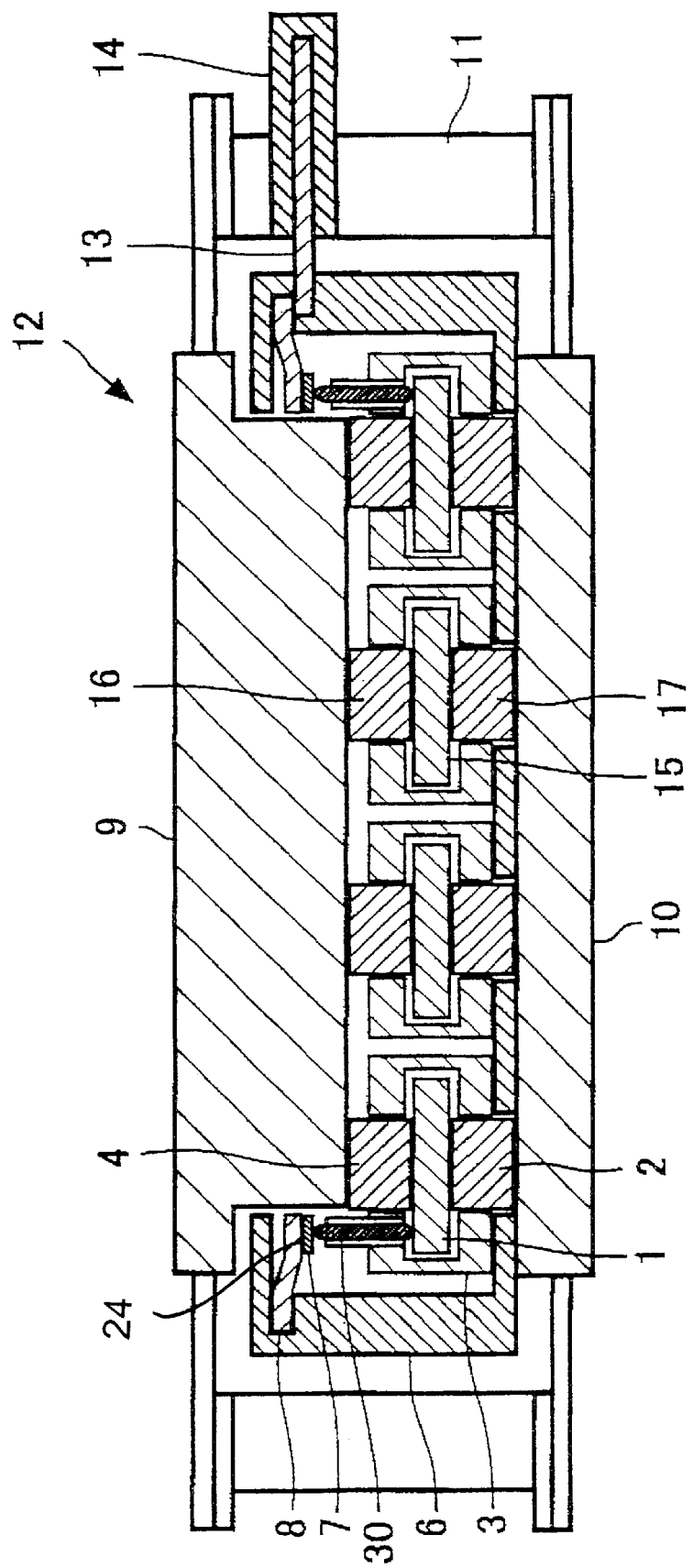
FIG. 5 is a cross sectional view of a semiconductor apparatus according to a second embodiment of the invention.

FIG. 5 is a cross sectional view of a semiconductor apparatus according to a second embodiment of the invention. In FIG. 5, the same reference numerals as used in FIG. 3 are used for designating the same constituent elements and their duplicated explanations are omitted for the sake of simplicity. Referring now to FIG. 5, the pressure contact electrode for transmitting a control signal to an IGBT chip 1 is formed of a nonelastic electrically conductive pin 30 and the protrusion 24 protruding from the gate liner 8. According to the second embodiment, the protrusion 24 has an enough elasticity to press the pin 30 to the IGBT chip 1.

The pin 30 is slidably inserted into a pipe fixed to the positioning guide 3 and positioned precisely onto the gate pad of the IGBT chip 1. The positioned pin 30 is pressed to the gate pad of the IGBT chip 1 by the elasticity of the protrusion 24 of the gate liner 8 to complete the control electrode wiring between the silicon chip resistor 7 and the gate pad of the IGBT chip 1. The specific resistance of the pressure contact electrode is reduced by using very conductive metal for the pin 30.

Although the invention has been explained in connection with the preferred embodiments thereof, changes and modifications are apparent to those skilled in the art without departing from the gist of the invention. For example, the elastic pressure contact electrode is not limited to the contact probe 5 having two distal contact ends. Alternatively, a helical spring or a plate spring having two ends provided with electrically conductive contact means may be used for the elastic pressure contact electrode. Still alternatively, an electrically conductive cylindrical rubber may be used alone for the elastic pressure contact electrode. Since the elastic pressure contact electrode is formed of a single constituent element in this case, the number of the constituent elements is reduced.

In the illustrated embodiment, sixteen semiconductor chips are incorporated in a flat package. The number of the semiconductor chips in a flat package may be changed based on the desired current capacity. In the illustrated embodiment, the semiconductor units in the central part of the package include freewheel diodes without control electrodes. Alternatively, an additional gate liner, to which silicon chip resistors are fixed, may be arranged on the central part and IGBT chips are situated in the central part of the package. Alternatively, the semiconductor chip may be any other semiconductor device, such as an MOS control thyristor and an MOS transistor.

As explained above, the semiconductor apparatus according to the invention includes pressure contact electrodes working as control electrodes, positioning guides, emitter contact terminals and collector base plates. These constituent elements are disposed corresponding to a plurality of IGBTs housed in a flat package. Each of the pressure contact electrodes has two distal contact ends. The semiconductor apparatus also includes an insulative outer frame and a gate liner having silicon chip resistors formed thereon corresponding to the respective locations of the pressure contact electrodes. The pressure contact electrodes are positioned by the positioning guides precisely onto the respective gate pads of the corresponding IGBTs, and the gate liner is fixed to the insulative outer frame such that the pressure contact electrodes connect the respective silicon chip resistors on the gate liner and the respective gate pads of the IGBTs by pressure contact.

In the pressure contact wiring according to the invention, the precise positioning of gate wiring is not lowered even when many IGBTs are connected parallel to each other in a package, to thereby reduce the number of constituent elements and to provide a highly reliable and small-sized semiconductor apparatus of the pressure contact type that exhibits a high breakdown voltage. According to the invention, the gate pad and the pressure contact electrode are held in the respective locations without impairing the positional relation therebetween even when thermal stress by the constituent elements occurs in the package. Since more semiconductor chips may be mounted on a package according to the invention, a flat IGBT package with a greatly increased current capacity is obtained.

What is claimed is:
1. A semiconductor apparatus comprising:
a plurality of semiconductor chips arranged in a flat form, each semiconductor chip including a first major surface having a first main electrode and a control electrode, and a second major surface at a side opposite to the first major surface and having a second main electrode, a control base plate including an opening formed at a position corresponding to the first major electrode of the semiconductor chip and an electrically conductive section formed at a position facing the control electrode of the semiconductor chip, a silicon chip resistor disposed on the electrically conductive section of the control base plate, and at least one pressure contact electrode having two distal contact ends and being positioned between the control electrode of the semiconductor chip and the electrically conductive section of the control base plate, one of the distal contact ends contacting the control electrode and the other of the distal contact ends contacting the electrically conductive section of the control base plate through the silicon chip so that the at least one pressure contact electrode transmits a control signal from the control base plate to the semiconductor chip.

2. A semiconductor apparatus according to claim 1, wherein said at least one pressure contact electrode has elasticity in a direction perpendicular to the first major surface of the control electrode of the semiconductor chip.

3. A semiconductor apparatus according to claim 2, wherein said at least one pressure contact electrode is a contact probe including pressure contactors forming the distal contact ends and a spring situated between the pressure contactors, the spring pressing one of the pressure contactors to the control electrode of the semiconductor chip and the other of the pressure contactors to the electrically conductive section of the control base plate.

4. A semiconductor apparatus according to claim 1, wherein said at least one pressure contact electrode is a nonelastic electrically conductive pin, and the electrically conductive section of the control base plate has elasticity to thereby press the nonelastic electrically conductive pin to the control electrode of the semiconductor chip.

5. A semiconductor apparatus according to claim 1, further comprising a contact terminal disposed on the first main electrode of the semiconductor chip for electrical conduction, a base plate situated beneath the second main electrode of the semiconductor chip for electrical conduction, and a positioning guide for precisely positioning the contact terminal on the first main electrode and the base plate beneath the second main electrode, said positioning guide holding the pressure contact electrode to position the pressure contact electrode precisely on the control electrode of the semiconductor chip.

6. A semiconductor apparatus according to claim 1, wherein said semiconductor chip is a semiconductor device selected from the group consisting of an insulated gate bipolar transistor, a MOS control thyristor and a MOS transistor, and the semiconductor apparatus further includes freewheel diodes arranged in the flat form parallel to the semiconductor chips.

7. A semiconductor apparatus according to claim 1, wherein said opening of the control base plate receives a plurality of the semiconductor chips therein, said electrically conductive section being formed at each position facing the control electrode of each semiconductor chip, each pressure contact electrode connecting one control electrode of one semiconductor chip and one electrically conductive section of the control base plate.

8. A semiconductor apparatus according to claim 5, wherein said positioning guide includes two sections for holding the contact terminal, semiconductor chip and base plate therebetween.

9. A semiconductor apparatus comprising:

a plurality of semiconductor chips arranged in a flat form, each semiconductor chip including a first major surface having a first main electrode and a control electrode, and a second major surface at a side opposite to the first major surface and having a second main electrode, a control base plate including an opening formed at positions corresponding to the first major electrodes of the semiconductor chips, and electrically conductive sections, each being formed at each position facing the control electrode of each semiconductor chips, said opening receiving a plurality of the semiconductor chips therein, and pressure contact electrodes, each having two distal contact ends and being positioned between the control electrode of the semiconductor chip and the electrically conductive section of the control base plate, one of the distal contact ends contacting the control electrode and the other of the distal contact ends contacting the electrically conductive section of the control base plate, each pressure contact electrode connecting one control electrode and one electrically conductive section so that each pressure contact electrode transmits a control signal from the control base plate to the semiconductor chip.

* * * * *